United States Patent [19]
Mori et al.

[11] Patent Number: 5,691,210
[45] Date of Patent: Nov. 25, 1997

[54] METHOD FOR FABRICATION OF PROBE STRUCTURE AND CIRCUIT SUBSTRATE THEREFOR

[75] Inventors: Yoshihisa Mori; Atsushi Hino; Hitoshi Ishizaka, all of Ibaraki, Japan

[73] Assignee: Nitto Denko Corporation, Osaka, Japan

[21] Appl. No.: 728,076

[22] Filed: Oct. 9, 1996

[30] Foreign Application Priority Data

Oct. 9, 1995 [JP] Japan .................................. 7-261706

[51] Int. Cl.⁶ .................................................. H01L 21/66
[52] U.S. Cl. ............................... 437/8; 437/183; 437/213
[58] Field of Search ........................... 437/7, 8, 51, 183, 437/212, 213; 148/DIG. 162

[56] References Cited

U.S. PATENT DOCUMENTS

| | | | |
|---|---|---|---|
| 5,071,787 | 12/1991 | Mori et al. | 437/183 |
| 5,487,999 | 1/1996 | Farnworth | 437/8 |
| 5,513,430 | 5/1996 | Yanof et al. | 437/8 |
| 5,585,282 | 12/1996 | Wood et al. | 437/183 |

*Primary Examiner*—Chandra Chaudhari
*Attorney, Agent, or Firm*—Sughrue,Mion,Zinn,Macpeak & Seas, PLLC

[57] ABSTRACT

A method for fabrication of a probe structure comprising a circuit substrate comprising a circuit pattern formed on one side or inside of an insulating substrate and a positioning member formed on either side of said insulating substrate, said positioning member being capable of positioning and retaining a test target at a testing position of the probe structure, and the circuit pattern and the positioning member being in a positional relationship which establishes a continuity between the circuit pattern and a bump contact, which method comprises determining, on the same side of the substrate on which the positioning member has been formed, the position of the bump contact according to the position of the positioning member as a reference position, and forming the bump contact capable of establishing continuity with the circuit pattern. According to the method of the present invention, a probe structure can be obtained which is capable of positioning bump contacts and test target highly accurately as compared to conventional methods. In addition, since conventional production method can be applied to the manufacture of positioning member and bump contacts, highly precise products can be produced economically. The circuit substrate of the present invention which comprises a positioning member can be beneficially used for the production of the probe structure of the present invention.

11 Claims, 1 Drawing Sheet

METHOD FOR FABRICATION OF PROBE STRUCTURE AND CIRCUIT SUBSTRATE THEREFOR

FIELD OF THE INVENTION

The present invention relates to a method for fabrication of probe structures for circuit testing of small circuits such as semiconductor elements. More particularly, the present invention relates to a circuit substrate preferablyused for the fabrication of such probe structures.

BACKGROUND OF THE INVENTION

Along with the development of electronic equipments in recent years, miniaturization and multifunction of devices using semiconductor elements have been desired. In particular, a multi-tip module hasbeen attracting much attention as a useful means which allows highly dense mounting, since plural semiconductor elements can be mounted on.a single package.

As a reliability test of multi-chip modules, an accelerated test called a burn-in test is appliedwhich includes applying electricity under a high temperature environment.

A conventional burn-in test cannot test individual semiconductor elements economically when they are in the state of bare chips, i.e. naked semiconductor elements. Thus, plural semiconductor elements are mounted on a single substrate and sealed with a resin to give a package which is subjected to testing. When one of the plural semiconductor elements in the package is defective, other normal semiconductor elements are also wasted to ultimately lower the proportion of fine products.

For an increased proportion of fine multi-chip module products, it is desired to subject respective semiconductor elements when they are bare chips to burn-in testing, so that defective products can be excluded before mounting intomulti-chip modules.

In view of such a demand, a membrane type prove structure (hereinafter referred to simply as a probe structure) has been increasingly used.

The prove structure comprises bump contacts formed on a flexible insulating film substrate, and can be connected to outside measurement equipments via a circuit pattern formed on said insulating film substrate (see Japanese Patent Unexamined Publication No. 179683/1992). The bump contacts are conductive protrusions to be in direct contact with contact targets such as a circuit and an electrode pad.

Inasmuch as the probe structure enables finely-pitched arrangements of bump contacts and circuit patterns, it can establish an accurate positional relationship among bump contacts in a probe structure, which correspond to the positional relationship among mating contact targets (e.g., bare chips) formed also at a fine pitch. The dimensional stability of the prove structure is extremely high also in a burn-in test environment, thus proving its high contact reliability as compared to mechanical probe structures.

However, even if the probe structure itself is finely and highly accurately constructed, an accurate disposition (positioning) of the probe structure and a bare chip requires a separate, precise positioning technique in consideration of measurement, control, automatic assembly and the like.

A method for mechanically positioning probe structure and bare chip comprises, for example, forming a positioning member on the probe structure. The positioning member may be, for example, a frame-shaped member without the center portion thereof, so that a bare chip can be accurately fitted in there. In this case, the probe structure and the bare chip are positioned by this frame member. Accordingly, the positioning accuracy when establishing said frame member on the probe structure in turn determines the accuracy of positioning of the bare chip and probe structure.

One method for positioning and attaching a frame member to the probe structure includes, for example, forming an accurate positioning hole at a position common to both probe structure and frame member, and mechanically positioning them using a positioning pin and the like.

In this case, a clearance $r_1$ between the positioning pin and the positioning hole of the frame member, a positioning difference $r_2$ from the positioning hole of the probe structure, and a positioning difference $r_3$ from the positioning hole of the frame member determine the maximum positioning difference R between testing target and bump contact Thus, $R=[(r_1/2)^2+(r_3)^2]^{1/2}$, so that the accumulation of such positioning differences causes a relatively big error.

An alternative method for positioning and attaching a frame member to the probe structure includes, for example, varying the positions of both probe structure and frame member by image processing, and adhering and fixing the probe structure and frame member when the positional difference between them becomes minimum from the data obtained by the image processing.

An adhesive is preferably used for fixing in this case, since it is advantageous in that it allows smooth progression from adhesion to fixing. However, epoxy adhesives and polyimide adhesives, though they are sufficiently strong to allow permanent use for facilities, require heating and application of pressure for adhesion, during which process the adhesives may be softened to create unintended errors in, for example, positioning of the frame member. This leads to disadvantageous low positioning accuracy.

Accordingly, an object of the present invention is to provide a method for manufacturing more accurately and more economically a probe structure having a positioning member, which is capable of accurately positioning a probe structure and a test target.

Another object of the present invention is to provide a circuit substrate suitably used for the method of the present invention.

SUMMARY OF THE INVENTION

According to the present invention, there has now been provided a method for fabrication of a probe structure comprising a circuit substrate comprising a circuit pattern formed on one side or inside of an insulating substrate and a positioning member formed on either side of said insulating substrate, said positioning member being capable of positioning and retaining a test target at a testing position of the probe structure obtained by forming a bump contact on said circuit substrate, and the circuit pattern and the positioning member being in a positional relationship which establishes a continuity between the circuit pattern and a bump contact, which method comprises determining, on the same side of the substrate on which the positioning member has been formed, the position of the bump contact according to the position of the positioning member as a reference position, and forming the bump contact capable of establishing continuity with the circuit pattern.

The circuit substrate to be used in the present invention is as defined above and used particularly beneficially for the method of the present invention.

A conventional probe structure having a positioning member is based on an idea of further adding a positioning member to a completed probe structure. For this end, a positioning member is set by adhesion according to a bump contact as a reference position.

In contrast, the method of the present invention is characterized in that a positioning member is formed on a circuit substrate prior to forming bump contacts. This order of fabrication alters the conventional step of adjusting and installing a positioning member according to the position of bump contact as a reference position to a step comprising forming bump contacts according to the positioning member as a reference position. This affords a marked improvement in the error of precision of positional match of the positioning member and bump contact, from conventional error value of about ±50 μm to about ±2 μm.

The error created when installing a positioning member on an insulating substrate is absorbed by a comparatively greater tolerance due to the positional relationship between the positioning member and circuit pattern, and does not pose any problems.

When forming a positioning member on a circuit substrate, either a circuit pattern or a positioning member may be formed earlier on an insulating substrate, and they are not limited as long as they can maintain a positional relationship which allows the one formed earlier to be used as a reference position when forming the other.

DETAILED DESCRIPTION OF THE INVENTION

The present invention is described in more detail in the following.

Figure 1:
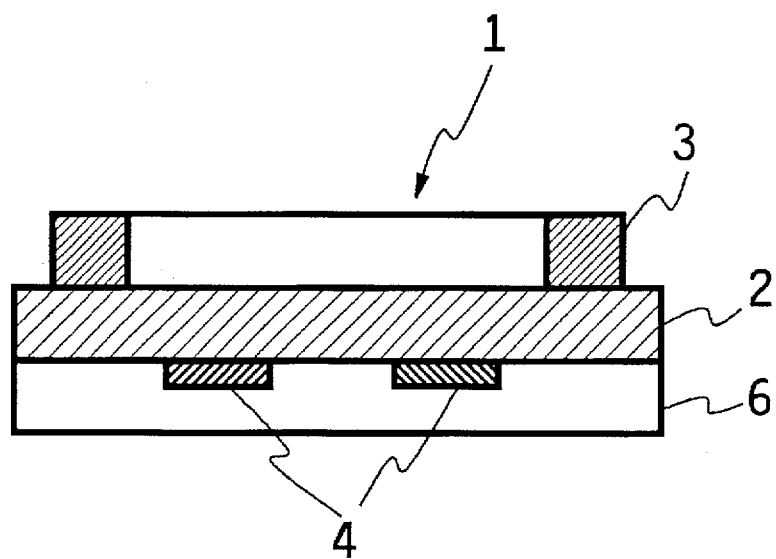
FIG. 1(a) and 1(b) schematically show one example of fabrication of the present invention. The circuit substrate of the present invention is shown by a reference number 1 in FIG. 1(a).
Figure 1:
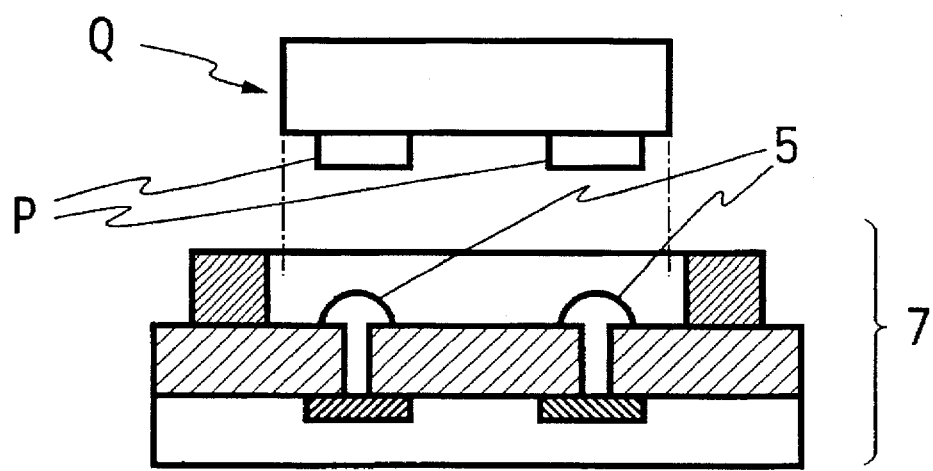

In FIG. 1(a) and 1(b) which schematically show one example of fabrication of the present invention, a circuit pattern and bump contacts are formed on opposite sides of an insulating substrate.

According to the process of the present invention, a circuit substrate 1 as shown in FIG. 1(a) is prepared first. Then, as shown in FIG. 1(b), bump contacts 5 electrically continuing with circuit patterns 4 are formed on an insulating substrate 2 of said circuit substrate 1, on the same side on which a positioning member 3 has been formed, according to the position of the positioning member 3 as a reference position so that the positional difference from contact parts P of a test target Q can be minimized, whereby a probe structure 7 of the present invention is completed.

The circuit substrate 1 of the present invention is explained in the following.

The circuit substrate 1 shown in FIG. 1(a) comprises circuit patterns 4 on one side of the insulating substrate 2, and the positioning member 3 on the reverse side.

The positioning member 3 can position and retain test target Q at a testing position of the probe structure 7 obtained by forming bump contacts 5 on said circuit substrate, as shown in FIG. 1(b).

Either one of circuit pattern 4 and positioning member 3 may be formed on the insulating substrate 2 first. The one to be formed later is formed according to the other formed earlier as a reference position. Specifically, circuit pattern 4 is formed on one side or inside of insulating substrate 2, and positioning member 3 is formed on either side of insulating substrate using the position of said circuit pattern 4 as a reference position. Alternatively, positioning member 3 is formed on one side of insulating substrate 2, and circuit pattern 4 is formed on one side or inside of the insulating substrate, using the position of said positioning member as a reference position.

Of these routes, the former wherein circuit pattern is formed prior to positioning member is preferable for the reason of easy fabrication.

The material of the insulating substrate is not particularly limited as long as it is electrically insulating, and can be a substrate for forming circuit pattern, positioning member, bump contact and the like. One having flexibility is particularly preferable. Specific examples include thermosetting resins and thermoplastic resins such as polyester resin, epoxy resin, urethane resin, polystyrene resin, polyethylene resin, polyamide resin, polyimide resin, acrylonitrile-butadiene-styrene (ABS) copolymer, polycarbonate resin, silicone resin and the like. Particularly preferred is polyimide resin superior in heat resistance and mechanical strength. While an eximer laser beam abrasion at an oscillation wavelength in the ultraviolet region of not more than 400 nm is known to be effective for elaborate processing of polymer, since polyimide resin has a great absorption spectrum in the ultraviolet region, polyimide resin is preferably used when this method is employed.

While the thickness of the insulating substrate is not particularly limited, it is preferably 5–150 μm, more preferably about 10–100 μm in view of the desirable mechanical strength and flexibility.

Any necessary number of circuit patterns can be formed separately for testing, as long as the pattern establishes continuity with bump contacts at required positions.

The position of the circuit pattern on or inside of the insulating substrate is not limited when circuit pattern is formed prior to positioning member as a reference, as long as it does not give difficulties in later processing. When the circuit pattern is formed after positioning member, the positions of the test target and bump contacts are determined by the positioning member. Thus, these positions should be considered, and the circuit pattern is formed based on the positioning member as a processing reference, so that the circuit pattern can establish continuity with the test target through bump contacts.

The circuit pattern can be formed on either side or inside of the insulating substrate.

It is preferable to form circuit pattern and positioning member on different sides of an insulating substrate, since probe structures having bump contacts and circuit pattern on different sides are generally used.

While the material of circuit pattern is not particularly limited as long as it has conductivity, good conductor materials used for known print boards are preferable, such as gold, silver, copper, aluminum, zinc, tin, nickel, platinum, 42 alloy and the like, and various alloys containing these as components (e.g., solder).

The circuit pattern maybe formed by a known method-such as an additive method which includes drawing a circuit pattern directly by a film-forming method (e.g., sputtering, electroless plating, and the like) and subtractive method which leaves only circuit patterns by etching, etc.

In a preferred embodiment, a coating layer 6 prepared from an insulating material is laminated on the insulating substrate on which circuit pattern has been formed, to cover the circuit pattern, as shown in FIG. 1(a). The insulating material to be used for this coating layer is the same as that used for the insulating substrate.

The thickness of the coating layer is preferably 3–100 μm, particularly preferably 5–50 μm.

The coating layer can be formed by a coating method such as casting, an adhesion method which adheres a film-like substance separately prepared from an insulating material, and other methods.

When the circuit pattern is sandwiched between two layers of an insulating substrate, the circuit pattern may be considered to have been formed inside of the insulating substrate.

The positioning member may be any as long as it can position and retain test target at testing position of the probe structure, and may consist of plural parts or a single part.

Preferable example of the positioning member is a frame product which a test target can be fitted in and retained as. such, utilizing a part or whole of the outer periphery of the test target. When the test target is rectangular, for example, the frame product can be prepared by extracting an area corresponding to the outer shape of the test target and an appropriate clearance therearound to have the test target retained in the entirety of the outer periphery. The test target is fitted into the extracted part of the frame product for positioning. The frame product may be a discontinuous frame which holds the test target by utilizing only the necessary portion of the target such as a corner and part of the sides.

When the positioning member is a frame product, the material thereof may be conductive or insulating as long as it permits precise processing. For example, iron, copper, aluminum, brass, iron-nickel alloy, silicon wafer, ceramic, polyimide resin and fluororesin can be used.

The thickness of the frame product is subject to no particular limitation and may be a thickness that avoids dislocation of the test target (e.g., semiconductor element) from the testing position. Particularly preferred is a thickness of not less than 50 μm.

The method for positioning the frame product on insulating substrate may include forming a positioning guide hole, positioning them with a pin, and fixing them with an adhesive.

The guide hole may be formed by laser processing using eximer laser, YAG laser, carbon dioxide gas laser and the like, dry etching such as plasma etching, or mechanical processing by punching and drilling.

The bump contacts are formed at positions corresponding to the contact parts of the test target, like bump contacts in known membrane-type probe structures. In the present invention, however, bump contacts are formed at predetermined positions using the positioning member as a reference position, since the position of the test target has been already determined by the positioning member.

As mentioned earlier, the bump contacts are not generally formed on the same plane with the circuit pattern. When bump contacts are formed on one side of insulating substrate, for example, the corresponding circuit pattern is formed on the reverse side of the substrate or in a deep layer in the substrate at the position corresponding to the position of the bump contacts, and the bump contacts and circuit pattern are continued via through-holes. Such structure can be formed, for example, by the following method.

(1) A through-hole is formed in the insulating substrate from the positioning member side at a bump contact-forming position determined by the use of the position of positioning member as a reference position, so that the positional difference from contact part of the test target can be minimized, whereby circuit pattern is exposed in the through-hole.

(2) Then, a conductor metal is filled in the through-hole, and the good conductor metal or other conductive metals are allowed to protrude from the insulating substrate at the opening of said through-hole to form bump contacts.

In the above (1), the through-hole may be formed by any method, though the following method is preferable in view of its high precision. Specifically, the position of the positioning member is image-processed by a position reading apparatus comprising a photographing device such as a CCD camera and calculating device such as a computer; a through-hole forming position is calculated using the obtained position as a processing reference position, so that the difference between the positions of the contact part of the test target to be positioned by the positioning member during testing and the position of the bump contacts to be formed can be minimized; and a through-hole is formed by a processing device which is controlled based on the calculated figures. This method makes positioning precision of bump contacts relative to the positioning member +2 μm from the objective center position.

The through-hole may be formed by laser processing using eximer laser, YAG laser, carbon dioxide gas laser and the like, or dry etching such as plasma etching.

In (2) above, the conductor metal may be filled in the through-hole by electroplating using the circuit pattern as a negative electrode.

A special example of bump contact is one directly formed on the circuit pattern in such a manner that it protrudes from said circuit pattern.

The shape of the bump contact is typically semisphere, which may have protrusion on the surface for desired use or may have a flat shape. The height of the bump contact is not particularly limited. When the test target is small like semiconductor element, the height is generally 2 μm–200 μm, particularly preferably about 10 μm–100 μm.

The material of bump contact is preferably conductive metal . materials capable of precipitating by electroplating, such as known good conductors (e.g., gold, silver, copper, platinum, zinc, tin, aluminum, nickel, cobalt, indium, rhodium, chromium, iron, tungsten, ruthenium and palladium), and various alloys containing these as components (e.g., solder, tin-nickel, gold-cobalt, nickel-phosphorus and nickel-boron). These metal materials may be used in combination to form multi-layer bump contacts for certain uses.

The present invention is described more specifically in the following by way of illustrative embodiments.

In this embodiment, a circuit pattern was formed on the insulating substrate, after which a positioning member was formed. The probe structure comprised circuit pattern and bump contacts respectively formed on opposite sides of the insulating substrate. The test target was a 10 mm×10 mm square bare chip. For explanation's sake, one side of the insulating substrate is called side A and the other side B.

Preparation of Circuit Substrate

A copper circuit pattern 4 was formed on side A of a 0.025 mm thick polyimide film of a flexible insulating substrate, as shown in FIG. 1(a), wherein the circuit pattern passed through the positions corresponding to bump contacts to be formed on side B and was to be connected to a connector at the edge of the substrate.

Then, a 0.01 mm thick polyimide coating layer 6 was applied on the circuit pattern and laminated.

Then, a positioning member was formed on side B of the insulating substrate by the use of the position of the circuit pattern on side A as a reference position, whereby the circuit substrate of the present invention was completed.

The positioning member was made from aluminum, and was a frame product having a square opening (through-hole, 10 mm×10 mm) in the center to allow free attachment and detachment of the above-mentioned bare chip.

The positioning member and insulating substrate were positioned by inserting a pin in the positioning hole, and fixed with an adhesive.

Preparation of Bump Contacts

Using a position reading apparatus comprising a CCD camera and a computer, the position of the opening at the center of the positioning member was read. Based on the inner wall surface as a reference position, the position of the bump contact was determined on the insulating substrate, and a through-hole for forming said bump contact was formed with eximer laser from side B at the determined position to expose the circuit pattern of side A on the bottom surface inside of the through-hole.

Using the circuit pattern as a negative electrode, nickel was precipitated by electroplating into the through-hole until it protrudes 30 μm from the insulating substrate surface to give a bump contact. The bump was covered with Au/Rh to give the probe structure of the present invention.

Using the obtained probe structure, a circuit testing of the bare chip was run, and subsequently the contact trace of the bump contacts on an electrode pad of the bare chip was examined. As a result, it was found that all bump contacts made contact at the preferable center position of the mating electrode pad on the bare chip, and highly accurate positioning was achieved.

According to the method of the present invention, a probe structure can be obtained which is capable of positioning bump contacts and test target highly accurately as compared to conventional methods. In addition, since conventional production method can be applied to the manufacture of positioning member and bump contacts, highly precise products can be produced economically. The circuit substrate of the present invention which comprises a positioning member can be beneficially used for the production of the probe structure of the present invention.

What is claimed is:

1. A method for fabrication of a probe structure comprising a circuit substrate comprising a circuit pattern formed on one side or inside of an insulating substrate and a positioning member formed on either side of said insulating substrate, said positioning member being capable of positioning and retaining a test target at a testing position of the probe structure, and the circuit pattern and the positioning member being in a positional relationship which establishes a continuity between the circuit pattern and a bump contact, which method comprises determining, on the same side of the substrate on which the positioning member has been formed, the position of the bump contact according to the position of the positioning member as a reference position, and forming the bump contact capable of establishing continuity with the circuit pattern.

2. A method for producing a probe structure, which comprises the following steps (1) and (2):
    (1) forming a circuit pattern on one side or inside of an insulating substrate and forming a positioning member on either side of the insulating substrate, said positioning member being capable of positioning and retaining a test target at a testing position, and either the circuit pattern or the positioning member being formed earlier on the insulating substrate, and then
    (2) determining the position of the bump contact on the insulating substrate on the side on which the positioning member has been formed, according to the position of the positioning member as a reference position, and forming the bump contact to establish continuity with the circuit pattern.

3. The method of claim 1, wherein the positioning member is a frame product which the test target can be fitted in and retained there by utilizing a part or whole of the outer periphery of the test target.

4. The method of claim 2, wherein the positioning member is a frame product which the test target can be fitted in and retained there by utilizing a part or whole of the outer periphery of the test target.

5. The method of claim 1, wherein the circuit pattern and the positioning member of the circuit substrate are formed on different sides of the insulating substrate, the circuit pattern and the bump contact are electrically continued by a through-hole formed in the insulating substrate, and the step for forming the bump contact comprises forming the through-hole at the position of the insulating substrate where the bump contact is to be formed, from the side of the positioning member to expose the circuit pattern inside the throughhole, filling a conductive metal in said through-hole, and allowing, at the opening of the through-hole, said conductive metal or a different conductive metal to protrude from the surface of the insulating substrate.

6. The method of claim 2, wherein, in the step (1), the circuit pattern and the positioning member are formed on different sides of the insulating substrate.

7. The method of claim 1, wherein the position of the bump contact is determined by specifying the position of the positioning member by image processing, and calculating according to the position of the positioning member as a reference position.

8. The method of claim 2, wherein the position of the bump contact is determined by specifying the position of the positioning member by image processing, and calculating according to the position of the positioning member as a reference position.

9. The method of claim 7, wherein a positional relationship between the positioning member and the bump contact is such that an error in the precision thereof is not more than ±2 μm.

10. The method of claim 8, wherein a positional relationship between the positioning member and the bump contact is such that an error in the precision thereof is not more than ±2 μm.

11. The method of claim 1, wherein the circuit pattern of the circuit substrate is formed prior to the positioning member, and the position of the positioning member is determined based on the position of the circuit pattern as a reference position.

* * * * *